United States Patent
Xie et al.

(10) Patent No.: US 10,950,672 B2
(45) Date of Patent: Mar. 16, 2021

(54) FLEXIBLE DISPLAY DEVICE WITH HARDENED LAYER, DISPLAY APPARATUS, AND METHOD FOR MANUFACTURING THE FLEXIBLE DISPLAY DEVICE

(71) Applicant: BOE TECHNOLOGY GROUP CO., LTD., Beijing (CN)

(72) Inventors: Chunyan Xie, Beijing (CN); Jianwei Li, Beijing (CN); Liqiang Chen, Beijing (CN); Song Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 20 days.

(21) Appl. No.: 16/130,099

(22) Filed: Sep. 13, 2018

(65) Prior Publication Data
US 2019/0131363 A1 May 2, 2019

(30) Foreign Application Priority Data

Oct. 30, 2017 (CN) .......................... 2017 1 1035268

(51) Int. Cl.
| | |
|---|---|
| *H01L 27/32* | (2006.01) |
| *H01L 51/56* | (2006.01) |
| *G09F 9/30* | (2006.01) |
| *H01L 51/52* | (2006.01) |
| *H01L 51/00* | (2006.01) |

(52) U.S. Cl.
CPC .......... *H01L 27/3244* (2013.01); *G09F 9/301* (2013.01); *H01L 27/3276* (2013.01); *H01L 51/0097* (2013.01); *H01L 51/5253* (2013.01); *H01L 51/56* (2013.01); *H01L 2251/5338* (2013.01)

(58) Field of Classification Search
CPC ........ H01L 27/3244; H05K 2201/2009; H05K 1/0281
See application file for complete search history.

(56) References Cited

U.S. PATENT DOCUMENTS

| | | | | |
|---|---|---|---|---|
| 6,414,397 | B1 * | 7/2002 | Sawamoto | ........ H01L 23/49827 257/783 |
| 2011/0139747 | A1 * | 6/2011 | Lee | ...................... H01L 51/5253 216/37 |
| 2015/0090990 | A1 * | 4/2015 | Tsuruoka | ............ H01L 51/0097 257/40 |
| 2017/0131591 | A1 * | 5/2017 | Rantala | ................... C08L 83/06 |
| 2018/0011576 | A1 * | 1/2018 | Ryu | ....................... G06F 1/1652 |

FOREIGN PATENT DOCUMENTS

WO  WO-2012172937 A1 * 12/2012  ............. H01L 23/36

* cited by examiner

*Primary Examiner* — Khiem D Nguyen
*Assistant Examiner* — Laura M Dykes
(74) *Attorney, Agent, or Firm* — Dinsmore & Shohl LLP

(57) ABSTRACT

The present disclosure provides a flexible display device, a display apparatus, and a method for manufacturing the flexible display device. The flexible display device comprises a flexible display panel, a hardened layer, and an integrated circuit layer with bumps. A front surface of the flexible display panel is provided with a circuit bonding region. The flexible display panel comprises a first flexible substrate. The hardened layer is on the first flexible substrate. The hardened layer is at a position corresponding to the circuit bonding region. The integrated circuit layer is bonded to the circuit bonding region by the bumps.

17 Claims, 6 Drawing Sheets

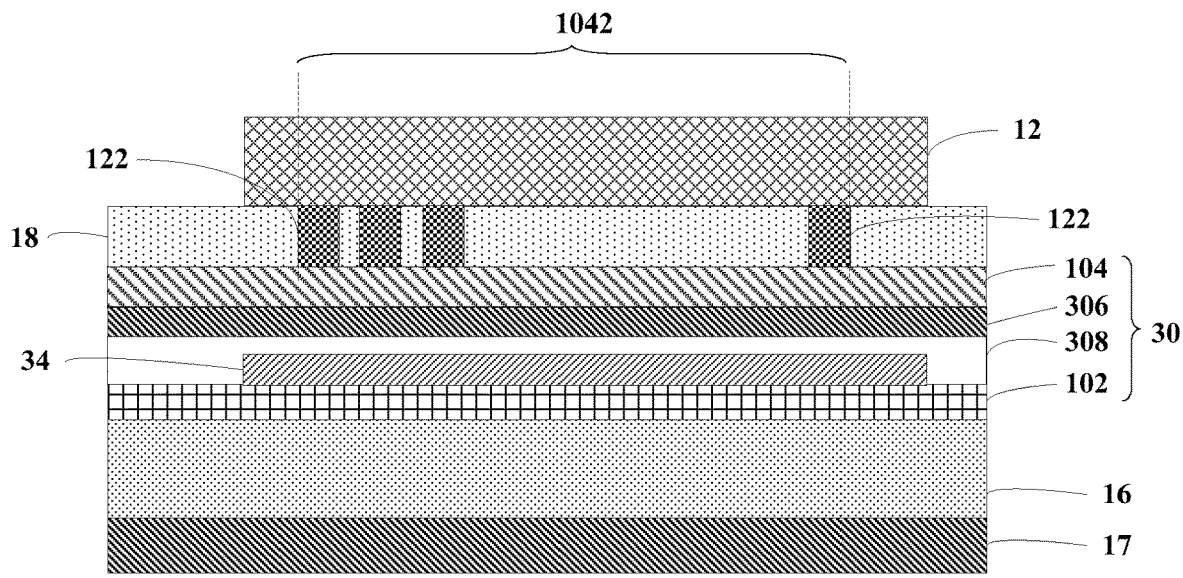

Fig. 3

Provide a flexible display panel, a front surface of the flexible display panel provided with a circuit bonding region, the flexible display panel comprising a first flexible substrate, the circuit bonding region being above the first flexible substrate, a back surface of the first flexible substrate being a back surface of the flexible display panel — S42

Form a hardened layer on the back surface of the first flexible substrate, the hardened layer being at a position corresponding to the circuit bonding region — S44

Bond bumps of an integrated circuit layer to the circuit bonding region to bond the integrated circuit layer to the flexible display panel — S46

Fig. 4

Provide a flexible display panel, a front surface of the flexible display panel provided with a circuit bonding region, the flexible display panel comprising a first flexible substrate, the circuit bonding region being above the first flexible substrate, a back surface of the first flexible substrate being a back surface of the flexible display panel, a hardened layer being formed on the front surface of the first flexible substrate, and the hardened layer being at a position corresponding to the circuit bonding region — S62

Bond bumps of an integrated circuit layer to the circuit bonding region to bond the integrated circuit layer to the flexible display panel — S64

Fig. 6

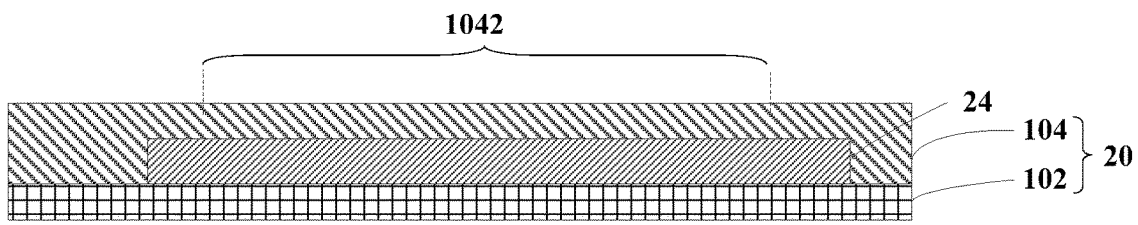

Fig. 7

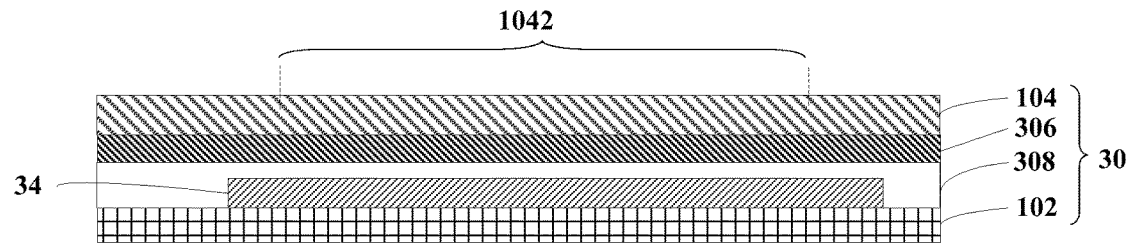

Fig. 8

FLEXIBLE DISPLAY DEVICE WITH HARDENED LAYER, DISPLAY APPARATUS, AND METHOD FOR MANUFACTURING THE FLEXIBLE DISPLAY DEVICE

CROSS-REFERENCE TO RELATED APPLICATIONS

The present application claims priority to China Patent Application No. 201711035268.9 filed on Oct. 30, 2017, the disclosure of which is incorporated by reference herein in its entirety.

TECHNICAL FIELD

The present disclosure relates to a flexible display device, a display apparatus, and a method for manufacturing the flexible display device.

BACKGROUND

At present, COF (Chip on Flex) is generally used to realize the bonding between a flexible display screen and an IC (integrated circuit). COF is a soft material that does not cause wire breakage when pressure-bonded to the flexible display screen. However, the cost of COF is high and circuit wires cannot be made too thin. By COP (Chip on plastic), the IC is directly bonded on the flexible display screen, which is the future development direction.

SUMMARY

According to an aspect of some embodiments of the present disclosure, there is provided a flexible display device comprising: a flexible display panel, a front surface of the flexible display panel provided with a circuit bonding region, the flexible display panel comprising a first flexible substrate, the circuit bonding region being above the first flexible substrate; a hardened layer on the first flexible substrate, wherein the hardened layer is at a position corresponding to the circuit bonding region; and an integrated circuit layer with bumps, the integrated circuit layer being bonded to the circuit bonding region by the bumps.

In some embodiments, a projection of the hardened layer on the front surface of the flexible display panel at least partially coincides with the circuit bonding region.

In some embodiments, an area of the hardened layer is greater than or equal to an area of the circuit bonding region.

In some embodiments, the flexible display panel further comprises a second flexible substrate, wherein the hardened layer is between the first flexible substrate and the second flexible substrate.

In some embodiments, a back surface of the first flexible substrate is a back surface of the flexible display panel, and the hardened layer is on the back surface of the first flexible substrate.

In some embodiments, the flexible display device further comprises: a base film layer; and a first adhesive layer covering the hardened layer and the back surface of the flexible display panel, configured to adhere the base film layer to the back surface of the flexible display panel; wherein, a thickness of the hardened layer is less than a thickness of a portion of the first adhesive layer covering the back surface of the flexible display panel.

In some embodiments, a back surface of the first flexible substrate is a back surface of the flexible display panel, a front surface of the first flexible substrate is a surface opposite to the back surface of the first flexible substrate, and the hardened layer is on the front surface of the first flexible substrate.

In some embodiments, a thickness of the hardened layer ranges from 5 micrometers to 50 micrometers.

In some embodiments, a material of the hardened layer comprises: siloxane or a resin containing inorganic nanoparticles.

In some embodiments, the bumps are bonded to the circuit bonding region by a second adhesive layer.

According to another aspect of some embodiments of the present disclosure, there is provided a display apparatus comprising: a flexible display device as described above.

According to another aspect of some embodiments of the present disclosure, there is provided a method for manufacturing a flexible display device, comprising: providing a flexible display panel, a front surface of the flexible display panel provided with a circuit bonding region, the flexible display panel comprising a first flexible substrate, the circuit bonding region being above the first flexible substrate, a hardened layer being formed on the first flexible substrate, wherein the hardened layer is at a position corresponding to the circuit bonding region; and bonding bumps of an integrated circuit layer to the circuit bonding region to bond the integrated circuit layer to the flexible display panel.

In some embodiments, a projection of the hardened layer on the front surface of the flexible display panel at least partially coincides with the circuit bonding region.

In some embodiments, in the step of providing a flexible display panel, the flexible display panel further comprises a second flexible substrate, wherein the hardened layer is formed between the first flexible substrate and the second flexible substrate.

In some embodiments, in the step of providing a flexible display panel, a back surface of the first flexible substrate is a back surface of the flexible display panel, and the hardened layer is formed on the back surface of the first flexible substrate.

In some embodiments, before bonding the bumps of the integrated circuit layer to the circuit bonding region, the method further comprises: adhering abase film layer to the back surface of the flexible display panel by a first adhesive layer, the first adhesive layer covering the hardened layer and the back surface of the flexible display panel: wherein, a thickness of the hardened layer is less than a thickness of a portion of the first adhesive layer covering the back surface of the flexible display panel.

In some embodiments, a back surface of the first flexible substrate is a back surface of the flexible display panel, a front surface of the first flexible substrate is a surface opposite to the back surface of the first flexible substrate, and the hardened layer is formed on the front surface of the first flexible substrate.

In some embodiments, the step of providing a flexible display panel comprises: forming a hardened layer on the first flexible substrate by a wet coating process.

In some embodiments, the step of bonding bumps of an integrated circuit layer to the circuit bonding region comprises: bonding the bumps to the circuit bonding region using a second adhesive layer by a hot pressing process.

Other features of the present disclosure and the advantages thereof will become explicit by the following detailed descriptions of the exemplary embodiments of the present disclosure with reference to the accompanying drawings.

BRIEF DESCRIPTION OF THE DRAWINGS

The accompanying drawings, which constitute a part of the specification, describe the embodiments of the present disclosure and, together with the description, serve to explain the principles of the present disclosure.

The present disclosure will be more clearly understood from the following detailed description with reference to the accompanying drawings, in which:

FIG. 3 is a cross-sectional view showing the structure of a flexible display device according to other embodiments of the present disclosure:

FIG. 4 is a flow chart illustrating a method for manufacturing a flexible display device according to some embodiments of the present disclosure:

FIG. 6 is a flow chart illustrating a method for manufacturing a flexible display device according to other embodiments of the present disclosure;

FIG. 7 is a cross-sectional view showing the structure in a stage of the manufacturing process of a flexible display device according to other embodiments of the present disclosure;

FIG. 8 is a cross-sectional view showing the structure in a stage of the manufacturing process of a flexible display device according to other embodiments of the present disclosure;

FIG. 9 is a top view showing a flexible display device according to some embodiments of the present disclosure, wherein FIGS. 1, 2, and 3 are cross-sectional views of structures taken along line A-A' in FIG. 9;

Figure 1:
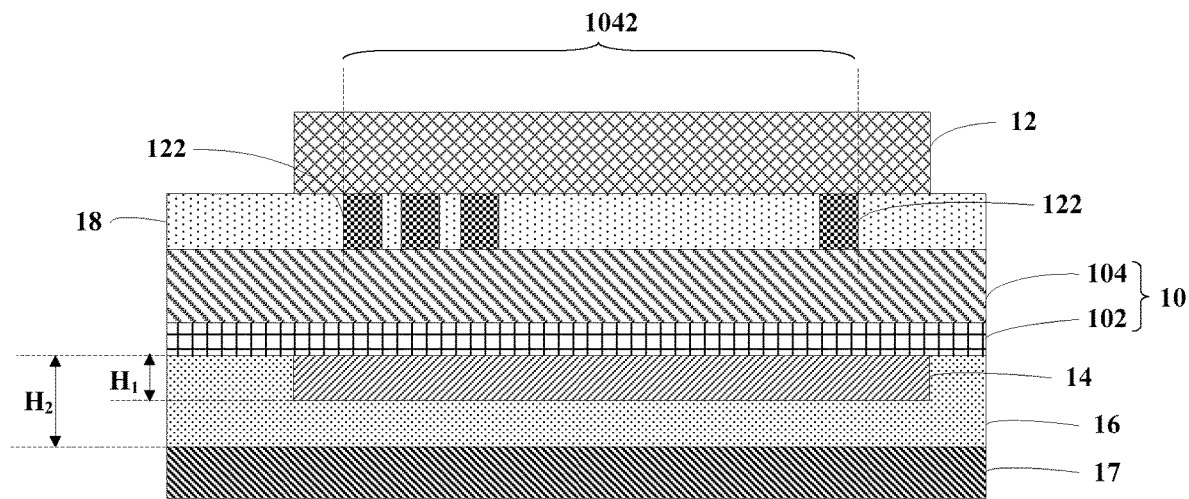
FIG. 1 is a cross-sectional view showing the structure of a flexible display device according to some embodiments of the present disclosure.

It should be understood that the dimensions of the various parts shown in the drawings are not drawn to the actual scale. In addition, the same or similar reference signs are used to denote the same or similar components.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, not limited to the embodiments described herein. These embodiments are provided so that this disclosure will be thorough and complete, and will fully convey the scope of the disclosure to those skilled in the art. Notice that, unless specifically stated otherwise. relative arrangement of components and steps, material composition, numerical expressions, and numerical values set forth in these embodiments are to be construed as merely illustrative, and not as a limitation.

The use of the terms "first", "second" and similar words in the present disclosure do not denote any order, quantity or importance, but are merely used to distinguish between different parts. A word such as "comprise" "contain" or variants thereof means that the element before the word covers the element(s) listed after the word without excluding the possibility of also covering other elements. The terms "up", "down", "left", "right" or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or the second component, or there may be no intervening component. When it is described that a specific component is connected to other components, the specific component may be directly connected to the other components without intervening components, or may have an intermediate component without being directly connected with the other components.

Unless otherwise defined, all terms (comprising technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of the specification.

The inventors of the present disclosure have found that in the process of directly bonding an IC to a flexible display screen by the COP method, direct pressure-bonding causes PSA (Pressure Sensitive Adhesive) in a back film structure bonded to the IC to flow since the hardness of the IC is relatively high. This causes the display panel to sag and causes wire breakage.

Further, in the related art, IC bumps are bonded to a circuit bonding region of a display panel by an ACF (Anisotropic Conductive Film). ACF is a conductive film that can achieve lateral insulation and longitudinal conduction. Performing a bonding process by ACF can achieve longitudinal conduction of an IC and circuits in the display panel.

The inventors of the present disclosure have also found that in the process of directly bonding an IC to a flexible display screen by the COP method, direct pressure-bonding of the IC may also cause a warp of the panel, resulting in the accumulation of ACF particles in the warp area of the panel. The ACF achieves conductive properties through conductive particles. Due to the flow deformation of a back adhesive layer (for example, PSA), particles will be excessively accumulated in the warp area of the panel and a lateral pressure is produced, which cause the ACF particles to be laterally crushed, thereby resulting in a lateral conductive condition. The lateral conductive ACF particles are in contact with the sides of the two IC bumps, thereby causing an IC short circuit.

Therefore, the COP method in the related art easily causes sagging deformation and warping of a display panel, thereby causes wire breakage and IC short circuit in the display panel.

In view of this, some embodiments of the present disclosure provide a structure of a flexible display device to alleviate the problem of sagging deformation and warping of a display panel caused by a process of bonding an integrated circuit layer to the flexible display panel. The structure of the flexible display device according to some embodiments of the present disclosure will be described in detail below with reference to the accompanying drawings.

FIG. 1 is a cross-sectional view showing the structure of a flexible display device according to some embodiments of the present disclosure.

Figure 9:
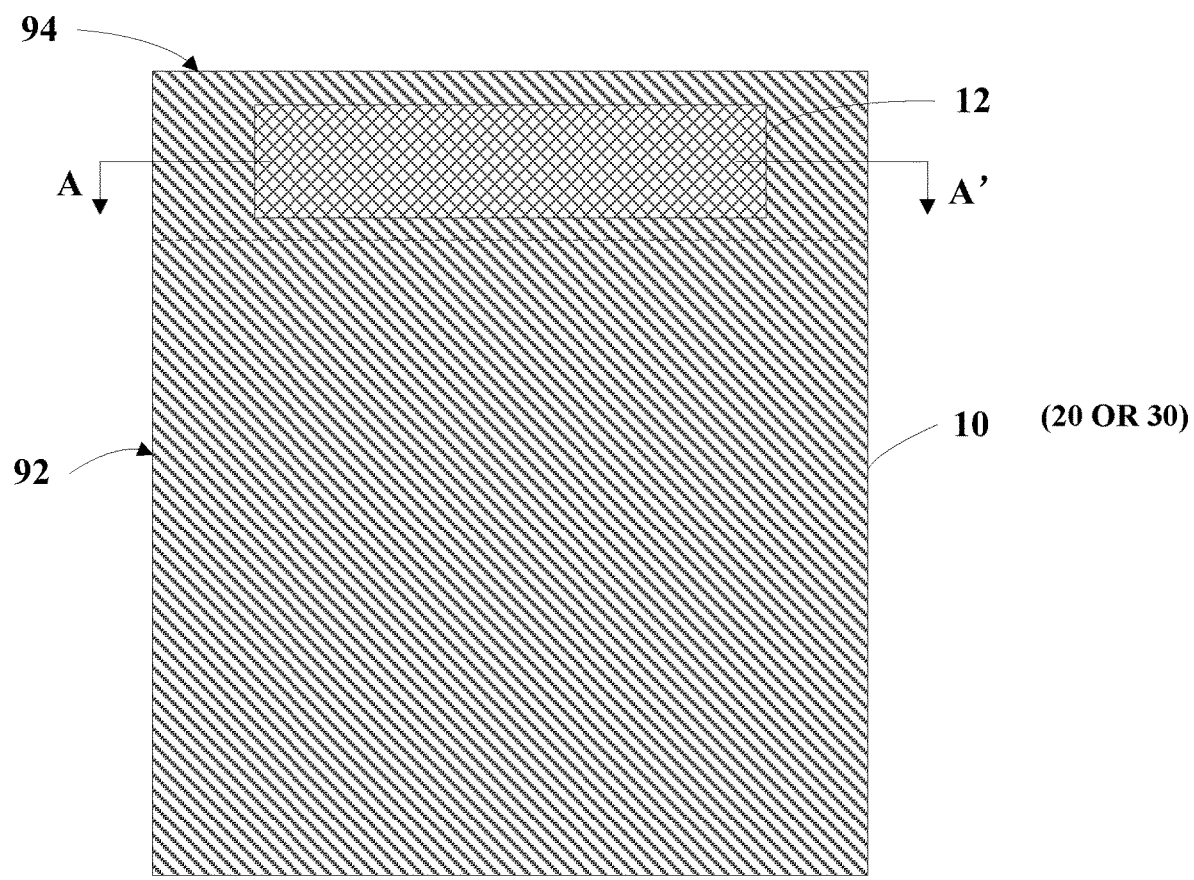

As shown in FIG. 1, the flexible display device comprises a flexible display panel 10. A front surface of the flexible display panel 10 is provided with a circuit bonding region 1042. In some embodiments, the flexible display panel comprises a display region 92 and a non-display region 94, as shown in FIG. 9, and the circuit bonding region is in the non-display region 94. Here, FIG. 1 is a cross-sectional view of the structure taken along line A-A' in FIG. 9. As shown in FIG. 1, the flexible display panel 10 comprises a first flexible substrate 102. The circuit bonding region 1042 is above the first flexible substrate 102.

As shown in FIG. 1, the flexible display device further comprises a hardened layer 14 on the first flexible substrate 102. The hardened layer 14 is at a position corresponding to the circuit bonding region 1042. For example, the hardened layer 14 is directly below the circuit bonding region 1042. Alternatively, the hardened layer 14 deviates from the position directly below the circuit bonding region 1042, with at least a portion of the hardened layer being directly below the circuit bonding region 1042. As another example, a projection of the hardened layer 14 on the front surface of the flexible display panel at least partially (for example, partially or completely) coincides with the circuit bonding region.

As shown in FIG. 1, the flexible display device further comprises an integrated circuit layer 12 with bumps 122. The integrated circuit layer 12 is bonded to the circuit bonding region 1042 by the bumps 122.

In the flexible display device of the above embodiment, a hardened layer corresponding to the circuit bonding region is on the first flexible substrate of the flexible display panel. This relieves the problem of sagging deformation and warping of the display panel caused in the process of bonding the integrated circuit layer to the flexible display panel. This avoids as much as possible the wire breakage which may be caused by the sagging deformation of the flexible display panel, and the short circuits occurred in the integrated circuit layer which may be caused by the warping of the flexible display panel.

In some embodiments, as shown in FIG. 1, a back surface of the first flexible substrate 102 is a back surface of the flexible display panel 10. The hardened layer is on the back surface of the first flexible substrate 102. In this embodiment, through providing a hardened layer corresponding to the circuit bonding region on the back surface of the first flexible substrate, the problem that the display panel may be deformed and warped in a process of bonding the integrated circuit layer to the flexible display panel is relieved.

In some embodiments, as shown in FIG. 1, the flexible display panel 10 further comprises a structural layer 104 on the first flexible substrate 102. A front surface of the structural layer 104 is the front surface of the flexible display panel 10. Of course, those skilled in the art will appreciate that material layers or function layers or the like contained in the structural layer 104 herein. For example, the structural layer 104 comprise a light emitting layer, a thin film encapsulation layer, a display panel circuit layer, or the like, which will not be described in detail herein.

In some embodiments, an area of the hardened layer 14 is greater than or equal to an area of the circuit bonding region 1042. This allows the hardened layer to cover the region under the circuit bonding region as much as possible, thereby the problem of the sagging deformation and warping of the display panel is relieved better.

In some embodiments, a material of the hardened layer 14 comprises: siloxane or a resin containing inorganic nanoparticles, etc. Of course, those skilled in the art will appreciate that, in other embodiments, the material of the hardened layer comprises other materials having hardening characteristics. Therefore, the scope of the embodiments of the present disclosure is not limited thereto.

In some embodiments, as shown in FIG. 1, the flexible display device further comprises a base film layer 17 and a first adhesive layer 16 covering the hardened layer 14 and the back surface of the flexible display panel 10 (for example, the back surface of the first flexible substrate 102). The base film layer 17 serves as a lower protective film of the flexible display panel, and provides protection and support for the flexible display panel. The first adhesive layer 16 is configured to adhere the base film layer 17 to the back surface of the flexible display panel 10. For example, the first adhesive layer 16 comprises a pressure sensitive adhesive. In some embodiments, the thickness $H_1$ of the hardened layer 14 is less than the thickness $H_2$ of a portion of the first adhesive layer 16 that covers the back surface of the flexible display panel. In this way, in the process of adhering the base film layer to the back surface of the flexible display panel, the first adhesive layer completely covers the hardened layer, thereby avoiding the problem of unevenness of the base film layer due to the hardened layer being higher than the back surface of the flexible display panel, and making the base film layer as flat as possible.

In some embodiments, a thickness of the hardened layer 14 ranges from 5 micrometers to 50 micrometers. For example, the thickness of the hardened layer 14 is 10 micrometers, 20 micrometers, 30 micrometers, or 40 micrometers, or the like. The hardened layer is within the above thickness range so that a relatively flat base film layer is obtained in the process of adhering the base film layer.

In some embodiments, as shown in FIG. 1, the bumps 122 are bonded to the circuit bonding region 1042 by a second adhesive layer 18. For example, the second adhesive layer 18 comprises ACF. Of course, those skilled in the art will appreciate that the way of bonding the bumps 122 to the circuit bonding region 1042 is not limited thereto. For example, the bumps 122 is also directly pressure-bonded to the circuit bonding region 1042.

Figure 2:
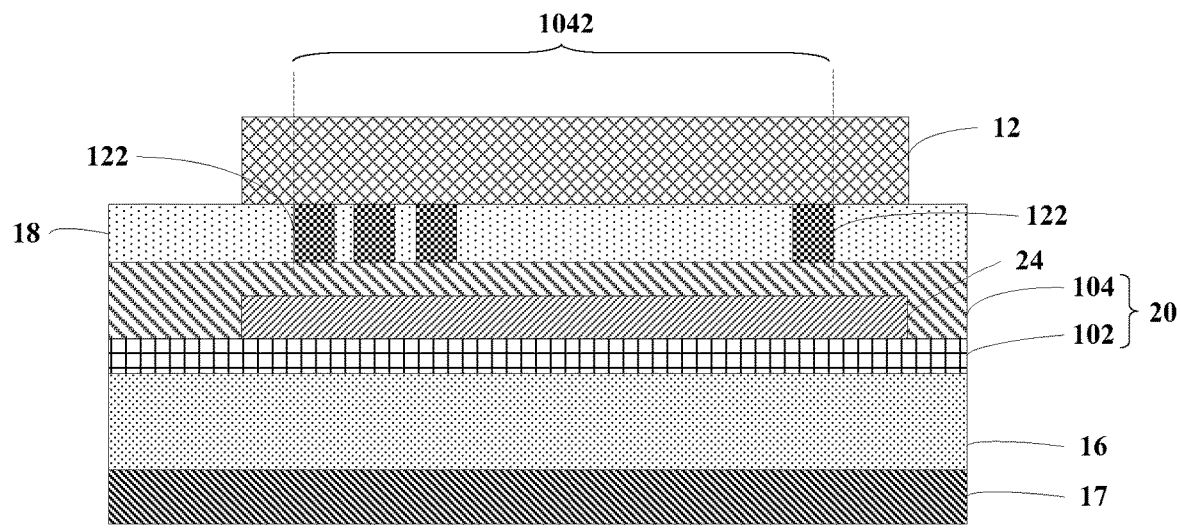
FIG. 2 is a cross-sectional view showing the structure of a flexible display device according to other embodiments of the present disclosure.

FIG. 2 is a cross-sectional view showing the structure of a flexible display device according to other embodiments of the present disclosure. Here, FIG. 2 is a cross-sectional view of the structure taken along line A-A' in FIG. 9. The structure of the flexible display device shown in FIG. 2 is similar to that of the flexible display device shown in FIG. 1. The structure of the flexible display device shown in FIG. 2 differs from that of FIG. 1 in that, in the flexible display device shown in FIG. 2, a hardened layer 24 is on a front surface of the first flexible substrate 102. Here, the back surface of the first flexible substrate 102 is the back surface of the flexible display panel 20, and the front surface of the first flexible substrate 102 is a surface opposite to the back surface of the first flexible substrate 102. The hardened layer 24 is inside the flexible display panel 20. Similarly, the hardened layer 24 is at a position corresponding to the circuit bonding region 1042. Here, the hardened layer 24 is disposed on the front surface of the first flexible substrate 102, i.e., it is disposed within the flexible display panel, and also relieves the problem of sagging deformation and warping of the display panel caused in the process of bonding the integrated circuit layer and the flexible display panel.

FIG. 3 is a cross-sectional view showing the structure of a flexible display device according to other embodiments of the present disclosure. Here, FIG. 3 is a cross-sectional view of the structure taken along line A-A' in FIG. 9. The structure of the flexible display device shown in FIG. 3 is similar to that of the flexible display device shown in FIG. 2. The structure of the flexible display device shown in FIG. 3 differs from that of FIG. 2 in that, the flexible display panel 30 shown in FIG. 3 further comprises a second flexible substrate 306. A hardened layer 34 is between the first flexible substrate 102 and the second flexible substrate 306. For example, as shown in FIG. 3, the second flexible substrate is above the first flexible substrate. In this embodiment, the hardened layer is in the double-layer flexible substrate structure within the flexible display panel, which also relieves the problem of sagging deformation and warping of the display panel caused in the process of bonding the integrated circuit layer and the flexible display panel.

Figure 11:
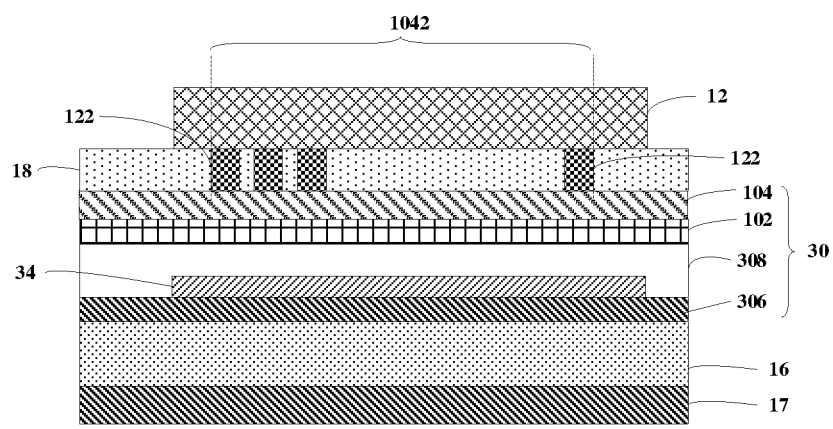
FIG. 11 is a cross-sectional view showing a structure of a flexible display device according to another embodiment of the present disclosure.

In some embodiments, in addition to the first flexible substrate 102 and the second flexible substrate 306, the double-layer flexible substrate structure shown in FIG. 3 further comprises an insulating layer 308 between the first flexible substrate 102 and the second flexible substrate 306. For example, the material of the insulating layer 308 comprises silicon dioxide. In some embodiments, as shown in FIG. 3, the hardened layer 34 is between the first flexible substrate 102 and the insulating layer 308. In other embodiments, the hardened layer 34 is between the insulating layer 308 and the second flexible substrate 306, as shown in FIG. 11.

In the flexible display device of the above embodiment, the hardened layer is provided on the first flexible substrate of the flexible display panel. For example, the hardened layer is provided on the front or back surface of the first flexible substrate. The hardened layer corresponds to the circuit bonding region. This relieves the problem of sagging deformation and warping of the display panel caused in the process of bonding the integrated circuit layer to the flexible display panel. This avoids as much as possible the wire breakage which may be caused by the sagging deformation of the flexible display panel and the short circuits occurred in the integrated circuit layer which may be caused by the warping of the flexible display panel.

In some embodiments of the present disclosure, a display apparatus is further provided. The display apparatus comprises the flexible display device described above, such as the flexible display device showed in FIG. 1, 2 or 3.

In some embodiments of the present disclosure, a method for manufacturing a flexible display device is further provided.

In some embodiments of the present disclosure, the manufacturing method comprises providing a flexible display panel. A front surface of the flexible display panel is provided with a circuit bonding region. The flexible display panel comprises a first flexible substrate. The circuit bonding region is above the first flexible substrate. A hardened layer is formed on the first flexible substrate. The hardened layer is at a position corresponding to the circuit bonding region. A back surface of the first flexible substrate is a back surface of the flexible display panel. For example, the hardened layer is formed on the back surface of the first flexible substrate. As another example, the hardened layer is formed on the front surface of the first flexible substrate.

In some embodiments, in the step of providing a flexible display panel, the flexible display panel further comprises a second flexible substrate. The hardened layer is between the first flexible substrate and the second flexible substrate. That is, in the case where the hardened layer is formed on the front surface of the first flexible substrate, the hardened layer is formed between the first flexible substrate and the second flexible substrate.

In some embodiments, the step of providing a flexible display panel comprises forming a hardened layer on the first flexible substrate by a wet coating process. For example, the hardened layer is formed on the front or back surface of the first flexible substrate by the wet coating process. Of course, those skilled in the art will appreciate that the step of providing a flexible display panel further comprises other steps, such as a step of forming a structural layer on the first flexible substrate.

In some embodiments of the present disclosure, the manufacturing method further comprise bonding bumps of an integrated circuit layer to the circuit bonding region to bond the integrated circuit layer to the flexible display panel. For example, the bumps are bonded to the circuit bonding regions using a second adhesive layer by a hot pressing process.

In the manufacturing method of the above embodiments, the hardened layer is formed on the first flexible substrate, and the hardened layer is at a position corresponding to the circuit bonding region. The integrated circuit layer is then bonded to the flexible display panel. In the bonding process, the hardened layer serves as a flat structure to absorb the stress, thereby evenly distributing the stress so that the pressure on the first adhesive layer is evenly distributed. This relieves the problem of sagging deformation and warping of the display panel caused in the process of bonding the integrated circuit layer to the flexible display panel, so that the wire breakage and the short circuits in the integrated circuit layer are avoided as much as possible.

Below, the manufacturing process of the flexible display device according to some embodiments of the present disclosure will be described in detail in such a condition that the hardened layer is formed on the back surface or front surface of the first flexible substrate.

Figure 5A:
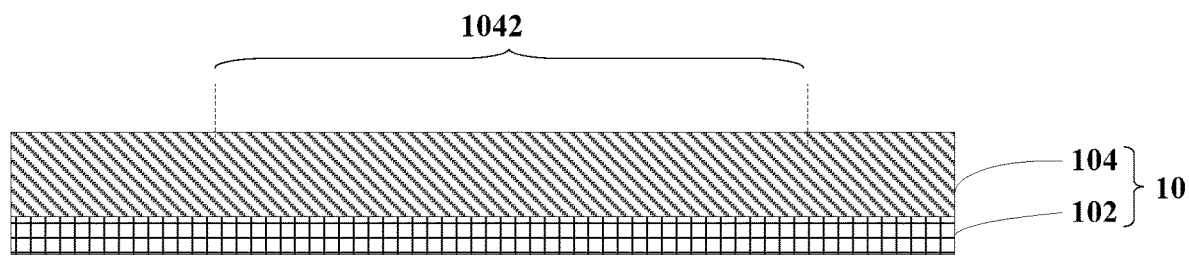
FIG. 5A is a cross-sectional view showing the structure in a stage of the manufacturing process of a flexible display device according to some embodiments of the present disclosure.
Figure 5B:
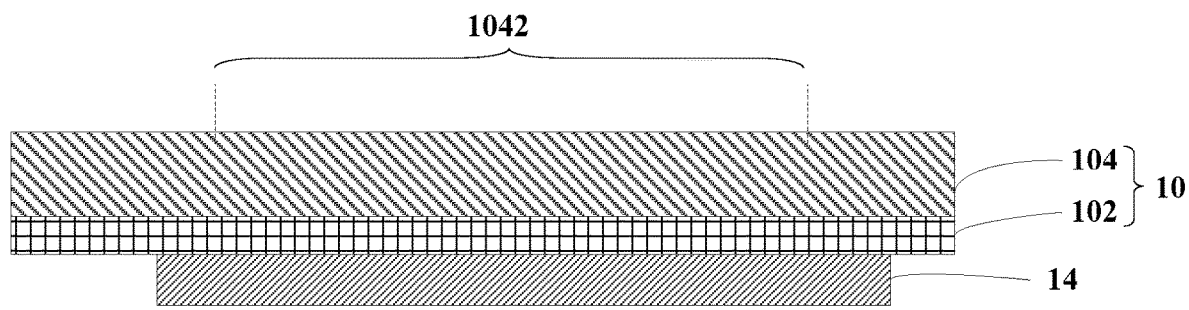
FIG. 5B is a cross-sectional view showing the structure in a stage of the manufacturing process of a flexible display device according to some embodiments of the present disclosure.

FIG. 4 is a flow chart illustrating a method for manufacturing a flexible display device according to some embodiments of the present disclosure. FIGS. 5A, 5B and 1 are cross-sectional views showing the structures in some stages of the manufacturing process of a flexible display device according to some embodiments of the present disclosure. The manufacturing process of a flexible display device according to some embodiments of the present disclosure will be described in detail below with reference to FIGS. 4, 5A. 5B, and 1.

As shown in FIG. 4, in step S42, provide a flexible display panel. A front surface of the flexible display panel is provided with a circuit bonding region. The flexible display panel comprises a first flexible substrate. The circuit bonding region is above the first flexible substrate. A back surface of the first flexible substrate is a back surface of the flexible display panel.

FIG. 5A is a cross-sectional view showing the structure in a step S42 of the manufacturing process of a flexible display device according to some embodiments of the present disclosure. As shown in FIG. 5A, a flexible display panel 10 is provided. A front surface of the flexible display panel 10 is provided with a circuit bonding region 1042. The flexible display panel 10 comprises a first flexible substrate 102. The circuit bonding region 1042 is above the first flexible substrate 102. For example, the circuit bonding region 1042 is above the front surface of the first flexible substrate 102. A back surface of the first flexible substrate 102 is a back surface of the flexible display panel 10. The flexible display panel 10 further comprises a structural layer 104 on the first flexible substrate 102, wherein the circuit bonding region 1042 is at the front surface of the structural layer 104.

In some embodiments, the step of providing a flexible display panel comprises coating a flexible substrate material layer on a glass carrier and curing the flexible substrate material layer into a film to form the first flexible substrate.

Figure 10:
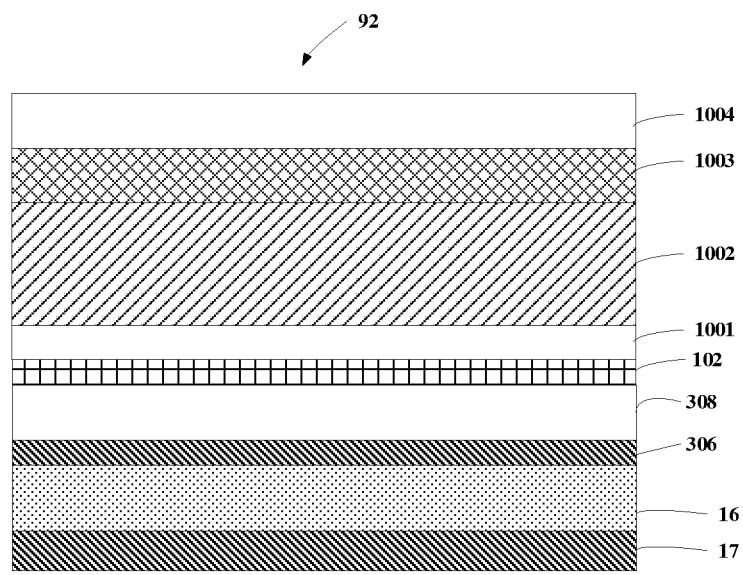
FIG. 10 is a cross-sectional view showing a display region of a flexible display panel of a flexible display device according to an embodiment of the present disclosure.

In some embodiments, the step of providing a flexible display panel further comprises forming a barrier layer 1001 on the first flexible substrate 102, and forming TFT (Thin Film Transistor) array elements 1002 on the barrier layer 1001, as shown in FIG. 10. For example, the barrier layer comprises silicon nitride, silicon oxide, or the like.

In some embodiments, the step of providing a flexible display panel further comprises forming a light emitting layer (for example, an OLED (Organic Light Emitting Diode) light emitting layer) 1003 on the TFT array elements 1002, and then forming a thin film encapsulation (TFE) 1004 on the light emitting layer 1003, as shown in FIG. 10. The TFE comprises a stacked structure of inorganic/organic layers.

In some embodiments, the step of providing a flexible display panel further comprises attaching an upper protective film on the thin film encapsulation, wherein the size of the upper protective film is larger than that of the first flexible substrate, thereby a flexible display panel is formed on the glass carrier; then the flexible display panel is lifted off from the glass carrier by laser. Here, the flexible display panel comprises the first flexible substrate and the structural layer on the first flexible substrate. For example, the structural layer comprises the barrier layer, TFT array elements, the light-emitting layer, the thin film encapsulation, or the like. In addition, the structural layer further comprises a display panel circuit layer or the like. For example, the display panel circuit layer is formed before forming the thin film encapsulation.

Returning to FIG. 4, in step S44, form a hardened layer on the back surface of the first flexible substrate, the hardened layer being at a position corresponding to the circuit bonding region.

FIG. 5B is a cross-sectional view showing the structure in a step S44 of the manufacturing process of a flexible display device according to some embodiments of the present disclosure. As shown in FIG. 5B, a hardened layer 14 is formed on the back surface of the first flexible substrate 102 (i.e., the back surface of the flexible display panel 10) by a wet coating process, for example. The hardened layer 14 is at a position corresponding to the circuit bonding region 1042. As shown in FIG. 5B, the hardened layer 14 is directly below the circuit bonding region 1042. Alternatively, the hardened layer 14 is at a position deviated from the circuit bonding region 1042 in the vertical direction, however, with at least a portion of the hardened layer being directly below the circuit bonding region 1042. As another example, a projection of the hardened layer 14 on the front surface of the flexible display panel 10 at least partially coincides with the circuit bonding region 1042.

Returning to FIG. 4, in step S46, bond bumps of an integrated circuit layer to the circuit bonding region to bond the integrated circuit layer to the flexible display panel.

FIG. 1 is a cross-sectional view showing the structure in a step S46 of the manufacturing process of a flexible display device according to some embodiments of the present disclosure. As shown in FIG. 1, by a hot pressing process, for example, the bumps 122 are bonded to the circuit bonding region 1042 using a second adhesive layer 18, thereby bonding the integrated circuit layer 12 to the flexible display panel 10.

In some embodiments, before bonding the bumps of the integrated circuit layer to the circuit bonding region, the manufacturing method further comprises: adhering the base film layer 17 to the back surface of the flexible display panel 10 by a first adhesive layer 16 (for example, PSA) to form the structure as shown in FIG. 1, the first adhesive layer covering the hardened layer 14 and the back surface of the flexible display panel 10. In some embodiments, the thickness $H_1$ of the hardened layer 14 is less than the thickness $H_2$ of the portion of the first adhesive layer 16 that covers the back surface of the flexible display panel.

In some embodiments, after adhering the base film layer, the method further comprises: cutting the flexible display panel. The cutting comprises full-cutting and half-cutting. Full-cutting refers to cutting off all the film layers to obtain a single display panel (which is referred to as a display panel unit). Half-cutting refers to cutting off one or two outermost film layers, for example, cutting off a portion of the upper protective film above the circuit bonding region. Then, the portion of the upper protective film above the circuit bonding region of each single display panel is removed, and COP bonding is performed, that is, bonding the bumps to the circuit bonding region by the second adhesive layer.

Heretofore, a method for manufacturing a flexible display device according to some embodiments of the present disclosure has been provided. In this manufacturing method, a hardened layer is formed on the back surface of the first flexible substrate. The hardened layer is at a position corresponding to the circuit bonding region. The integrated circuit layer is bonded to the flexible display panel. In the bonding process, the hardened layer serves as a flat structure to absorb the stress, thereby evenly distributing the stress so that the pressure on the first adhesive layer is evenly distributed. This avoids uneven stress conducted to the first adhesive due to uneven distribution of bumps, thereby preventing warping of the flexible display panel. Thus, the accumulation of ACF particles in the warped region of the flexible display panel is prevented, and thereby the IC short-circuit phenomenon caused by particles in contact with the sides of the two bumps is avoided. In addition, the method also prevents other problems such as the wire breakage caused by sagging deformation of the flexible display panel, thereby improving the yield of the bonding process.

In some embodiments, the manufacturing method further comprises: removing the upper protective film, and attaching an upper functional film (such as a POL (Polarizer), a touch function layer, etc.) to complete a modularity process, thereby forming a complete flexible module device.

FIG. 6 is a flow chart illustrating a method for manufacturing a flexible display device according to other embodiments of the present disclosure. FIG. 7 is a cross-sectional view showing the structure in a stage of the manufacturing process of a flexible display device according to other embodiments of the present disclosure. The manufacturing process of a flexible display device according to other embodiments of the present disclosure will be described in detail below with reference to FIGS. 6, 7, and 2.

As shown in FIG. 6, in step S62, provide a flexible display panel. A front surface of the flexible display panel is provided with a circuit bonding region. The flexible display panel comprises a first flexible substrate. The circuit bonding region is above the first flexible substrate. A back surface of the first flexible substrate is a back surface of the flexible display panel. A hardened layer is formed on the front surface of the first flexible substrate. The hardened layer is at a position corresponding to the circuit bonding region.

FIG. 7 is a cross-sectional view showing the structure in step S62 of the manufacturing process of a flexible display device according to other embodiments of the present disclosure. As shown in FIG. 7, a flexible display panel 20 is provided. A front surface of the flexible display panel 20 is provided with a circuit bonding region 1042. The flexible display panel 20 comprises a first flexible substrate 102. The circuit bonding region 1042 is above the first flexible substrate 102. A back surface of the first flexible substrate 102 is a back surface of the flexible display panel 20. A front surface of the first flexible substrate 102 is a surface opposite to the back surface of the first flexible substrate 102. A hardened layer 24 is formed on the front surface of the first flexible substrate 102. The hardened layer 24 is at a position corresponding to the circuit bonding region 1042. The flexible display panel 20 further comprises a structural layer 104 on the first flexible substrate 102. The circuit bonding region 1042 is at a front surface of the structural layer 104. The hardened layer 24 is between the first flexible substrate 102 and the structural layer 104.

In some embodiments, the step of providing a flexible display panel comprises: providing a first flexible substrate; forming a hardened layer on the first flexible substrate; and forming a structural layer covering the hardened layer on the first flexible substrate.

Returning to FIG. 6, in step S64, bond bumps of an integrated circuit layer to the circuit bonding region to bond the integrated circuit layer to the flexible display panel.

FIG. 2 is a cross-sectional view showing the structure in step S64 of the manufacturing process of a flexible display device according to other embodiments of the present disclosure. As shown in FIG. 2, by a hot pressing process, for example, the bumps 122 of the integrated circuit layer 12 are bonded to the circuit bonding region 1042 using a second adhesive layer 18, thereby bonding the integrated circuit layer 12 to the flexible display panel 20.

In some embodiments, before step S64, the manufacturing method further comprise: as shown in FIG. 2, adhering the base film layer 17 to the back surface of the flexible display panel 20 by a first adhesive layer 16.

Heretofore, a method for manufacturing a flexible display device according to other embodiments of the present disclosure has been provided. In this manufacturing method, a hardened layer is formed on the front surface of the first flexible substrate. That is, a hardened layer is formed within the flexible display panel. The hardened layer is at a position corresponding to the circuit bonding region. The integrated circuit layer is bonded to the flexible display panel. In the bonding process, the hardened layer serves as a flat structure to absorb the stress, thereby evenly distributing the stress so that the pressure on the first adhesive layer is evenly distributed. This relieves the problem of sagging deformation and warping of the display panel caused in the process of bonding the integrated circuit layer to the flexible display panel, so that the wire breakage and the short circuits in the integrated circuit layer are avoided as much as possible.

FIGS. 8 and 3 are cross-sectional views showing the structures in some stages of the manufacturing process of a flexible display device according to other embodiments of the present disclosure. The manufacturing process of a flexible display device according to other embodiments of the present disclosure will be described in detail below with reference to FIGS. 8 and 3.

Firstly, as shown in FIG. 8, a flexible display panel 30 is provided. A front surface of the flexible display panel 30 is provided with a circuit bonding region 1042. The flexible display panel 30 comprises a first flexible substrate 102. The circuit bonding region 1042 is above the first flexible substrate 102. A back surface of the first flexible substrate 102 is a back surface of the flexible display panel 30. A hardened layer 34 is formed on the front surface of the first flexible substrate 102. The hardened layer 34 is at a position corresponding to the circuit bonding region 1042. The flexible display panel 30 further comprises a structural layer 104 above the first flexible substrate 102. The circuit bonding region 1042 is at a front surface of the structural layer 104. In the step of providing a flexible display panel, as shown in FIG. 8, the flexible display panel 30 further comprises a second flexible substrate 306. The hardened layer 34 is disposed between the first flexible substrate 102 and the second flexible substrate 306. For example, the second flexible substrate 306 is above the first flexible substrate 102. The first flexible substrate and the second flexible substrate form a double-layer flexible substrate structure together.

In some embodiments, as shown in FIG. 8, the double-layer flexible substrate structure further comprises an insulating layer 308 between the first flexible substrate 102 and the second flexible substrate 306. The hardened layer 34 is between the first flexible substrate 102 and the insulating layer 308. In other embodiments, the hardened layer 34 is between the insulating layer 308 and the second flexible substrate 306 (not shown).

In some embodiments, the step of providing a flexible display panel comprises: providing a first flexible substrate; forming a hardened layer on the first flexible substrate: forming a second flexible substrate directly or indirectly covering the hardened layer; and forming a structural layer on the second flexible substrate.

Next, as shown in FIG. 3, a base film layer 17 is adhered to the back surface of the flexible display panel 20 by a first adhesive layer 16. Then, by a hot pressing process, the bumps 122 of the integrated circuit layer 12 are bonded to the circuit bonding region 1042 using a second adhesive layer 18, thereby bonding the integrated circuit layer 12 to the flexible display panel 30.

Heretofore, a method for manufacturing a flexible display device according to other embodiments of the present disclosure has been provided. In this manufacturing method, a hardened layer is formed between the first flexible substrate and the second flexible substrate. That is, a hardened layer is formed within the flexible display panel. The hardened layer is at a position corresponding to the circuit bonding region. The integrated circuit layer is bonded to the flexible display panel. In the bonding process, the hardened layer serves as a flat structure to absorb the stress, thereby evenly distributing the stress so that the pressure on the first adhesive layer is evenly distributed. This relieves the problem of sagging deformation and warping of the display panel caused in the process of bonding the integrated circuit layer to the flexible display panel, so that the wire breakage and the short circuits in the integrated circuit layer is avoided as much as possible.

Heretofore, various embodiments of the present disclosure have been described in detail. In order to avoid obscuring the concepts of the present disclosure, some details known in the art are not described. Based on the above description, those skilled in the art can understand how to implement the technical solutions disclosed herein.

Although some specific embodiments of the present disclosure have been described in detail by way of example, those skilled in the art should understand that the above examples are only for the purpose of illustration and are not intended to limit the scope of the present disclosure. It should be understood by those skilled in the art that the above embodiments may be modified or equivalently substituted for part of the technical features without departing from the scope and spirit of the present disclosure. The scope of the disclosure is defined by the following claims.

What is claimed is:

1. An organic light emitting diode (OLED) flexible display device, comprising:
    a flexible display panel, a front surface of the flexible display panel provided with a circuit bonding region, the flexible display panel comprising: a first flexible substrate, the circuit bonding region being above the first flexible substrate, a barrier layer on the first flexible substrate, thin film transistor (TFT) array elements on the barrier layer, a light emitting layer on the TFT array elements, and a thin film encapsulation on the light emitting layer, wherein the barrier layer, the TFT array elements, the light emitting layer, and the thin film encapsulation are in a display region of the flexible display panel;
    a hardened layer on the first flexible substrate, wherein the hardened layer is at a position corresponding to the circuit bonding region, the hardened layer is in a non-display region of the flexible display panel, a thickness of the hardened layer ranges from 5 micrometers to 50 micrometers, an area of the hardened layer is greater than or equal to an area of the circuit bonding region, and the first flexible substrate is between the hardened layer and the TFT array elements; and
    an integrated circuit layer with bumps, the integrated circuit layer being bonded to the circuit bonding region by the bumps;
    wherein the flexible display panel further comprises:
    a second flexible substrate, wherein the hardened layer is between the first flexible substrate and the second flexible substrate; and
    an insulating layer between the first flexible substrate and the second flexible substrate, wherein the insulating layer covers the hardened layer, the hardened layer is between the insulating layer and the second flexible substrate, the first flexible substrate is above the insulating layer, and the second flexible substrate is below the insulating layer.

2. The OLED flexible display device according to claim 1, wherein
    a projection of the hardened layer on the front surface of the flexible display panel at least partially coincides with the circuit bonding region.

3. The OLED flexible display device according to claim 1, wherein
    a back surface of the first flexible substrate is a back surface of the flexible display panel, and the hardened layer is on the back surface of the first flexible substrate.

4. The OLED flexible display device according to claim 1, further comprising:
    a base film layer; and
    a first adhesive layer covering the hardened layer and a back surface of the flexible display panel, configured to adhere the base film layer to the back surface of the flexible display panel;
    wherein, a thickness of the hardened layer is less than a thickness of a portion of the first adhesive layer covering the back surface of the flexible display panel.

5. The OLED flexible display device according to claim 1, wherein
    a back surface of the first flexible substrate is a back surface of the flexible display panel, the front surface of the first flexible substrate is a surface opposite to the back surface of the first flexible substrate, and the hardened layer is on the front surface of the first flexible substrate.

6. The OLED flexible display device according to claim 1, wherein
    a material of the hardened layer comprises: siloxane or a resin containing inorganic nanoparticles.

7. The OLED flexible display device according to claim 1, wherein
    the bumps are bonded to the circuit bonding region by a second adhesive layer.

8. A display apparatus, comprising: the OLED flexible display device according to claim 1.

9. The OLED flexible display device according to claim 1, wherein the first flexible substrate and the second flexible substrate are separated by the insulating layer.

10. A method for manufacturing an organic light emitting diode (OLED) flexible display device, comprising:
    providing a flexible display panel, a front surface of the flexible display panel provided with a circuit bonding region, the flexible display panel comprising a first flexible substrate, the circuit bonding region being above the first flexible substrate, a hardened layer being formed on the first flexible substrate, wherein the hardened layer is at a position corresponding to the circuit bonding region, the hardened layer is in a non-display region of the flexible display panel, a thickness of the hardened layer ranges from 5 micrometers to 50 micrometers, an area of the hardened layer is greater than or equal to an area of the circuit bonding region, and the flexible display panel further comprises: a second flexible substrate, wherein the hardened layer is formed between the first flexible substrate and the second flexible substrate, and an insulating layer between the first flexible substrate and the second flexible substrate, wherein the insulating layer covers the hardened layer, the hardened layer is between the insulating layer and the second flexible substrate, the first flexible substrate is above the insulating layer, and the second flexible substrate is below the insulating layer, and the providing of the flexible display panel comprises: forming a barrier layer on the first flexible substrate, forming TFT array elements on the barrier layer, the first flexible substrate being between the hardened layer and the TFT array elements, forming a light emitting layer on the TFT array elements, and forming a thin film encapsulation on the light emitting layer, wherein the barrier layer, the TFT array elements, the light emitting layer, and the thin film encapsulation are in a display region of the flexible display panel; and
    bonding bumps of an integrated circuit layer to the circuit bonding region to bond the integrated circuit layer to the flexible display panel.

11. The method according to claim 10, wherein
a projection of the hardened layer on the front surface of the flexible display panel at least partially coincides with the circuit bonding region.

12. The method according to claim 10, wherein in the step of providing the flexible display panel,
a back surface of the first flexible substrate is a back surface of the flexible display panel, and the hardened layer is formed on the back surface of the first flexible substrate.

13. The method according to claim 12, wherein before bonding the bumps of the integrated circuit layer to the circuit bonding region, the method further comprises:
adhering a base film layer to the back surface of the flexible display panel by a first adhesive layer, the first adhesive layer covering the hardened layer and the back surface of the flexible display panel;
wherein, a thickness of the hardened layer is less than a thickness of a portion of the first adhesive layer covering the back surface of the flexible display panel.

14. The method according to claim 10, wherein in the step of providing the flexible display panel,
a back surface of the first flexible substrate is a back surface of the flexible display panel, the front surface of the first flexible substrate is a surface opposite to the back surface of the first flexible substrate, and the hardened layer is formed on the front surface of the first flexible substrate.

15. The method according to claim 10, wherein the step of providing the flexible display panel comprises:
forming the hardened layer on the first flexible substrate by a wet coating process.

16. The method according to claim 10, wherein the step of bonding bumps of the integrated circuit layer to the circuit bonding region comprises:
bonding the bumps to the circuit bonding region using a second adhesive layer by a hot pressing process.

17. The method according to claim 10, wherein the first flexible substrate and the second flexible substrate are separated by the insulating layer.

* * * * *